United States Patent
Wieczorek et al.

(10) Patent No.: US 7,226,859 B2
(45) Date of Patent: Jun. 5, 2007

(54) METHOD OF FORMING DIFFERENT SILICIDE PORTIONS ON DIFFERENT SILICON-CONTAINING REGIONS IN A SEMICONDUCTOR DEVICE

(75) Inventors: Karsten Wieczorek, Dresden (DE); Manfred Horstmann, Dresden (DE); Rolf Stephan, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/282,720

(22) Filed: Oct. 29, 2002

(65) Prior Publication Data

US 2003/0162389 A1 Aug. 28, 2003

(30) Foreign Application Priority Data

Feb. 28, 2002 (DE) .................. 102 08 904

(51) Int. Cl.
*H01L 29/40* (2006.01)
(52) U.S. Cl. .................. 438/664; 438/231; 438/592
(58) Field of Classification Search ................ 438/231, 438/232, 407, 528, 532, 592, 655, 659, 664
See application file for complete search history.

(56) References Cited

U.S. PATENT DOCUMENTS

| | | | |
|---|---|---|---|
| 3,912,559 A | 10/1975 | Harigaya et al. | 148/187 |
| 4,107,835 A | 8/1978 | Bindell et al. | 29/590 |
| 4,599,789 A * | 7/1986 | Gasner | 438/224 |
| 4,897,368 A | 1/1990 | Kobushi et al. | 437/200 |
| 5,034,348 A | 7/1991 | Hartswick et al. | 437/200 |
| 5,248,892 A | 9/1993 | Van Roozendaal | 257/357 |
| 5,316,977 A | 5/1994 | Kunishima et al. | 437/200 |
| 5,317,187 A | 5/1994 | Hindman et al. | 257/659 |

(Continued)

FOREIGN PATENT DOCUMENTS

DE 19520782 A1 12/1995

(Continued)

OTHER PUBLICATIONS

U.S. Appl. No. 10/259,016, entitled "Semiconductor Device Having Different Metal-Semiconductor Portions Formed in a Semiconductor Region and a Method for Fabricating the Semiconductor Device," filed Sep. 27, 2002.

(Continued)

*Primary Examiner*—Phuc T. Dang
(74) *Attorney, Agent, or Firm*—Williams, Morgan & Amerson, P.C.

(57) ABSTRACT

A method is disclosed in which differing metal layers are sequentially deposited on silicon-containing regions so that the type and thickness of the metal layers may be adapted to specific characteristics of the underlying silicon-containing regions. Subsequently, a heat treatment is performed to convert the metals into metal silicides so as to improve the electrical conductivity of the silicon-containing regions. In this way, silicide portions may be formed that are individually adapted to specific silicon-containing regions so that device performance of individual semiconductor elements or the overall performance of a plurality of semiconductor elements may significantly be improved. Moreover, a semiconductor device is disclosed comprising at least two silicon-containing regions having formed therein differing silicide portions, wherein at least one silicide portion comprises a noble metal.

30 Claims, 4 Drawing Sheets

U.S. PATENT DOCUMENTS

| | | | |
|---|---|---|---|
| 5,352,631 A | 10/1994 | Sitaram et al. | 437/200 |
| 5,447,875 A | 9/1995 | Moslehi | 437/41 |
| 5,451,545 A | 9/1995 | Ramaswami et al. | 437/200 |
| 5,565,708 A | 10/1996 | Ohsaki et al. | 257/764 |
| 5,738,917 A | 4/1998 | Besser et al. | 427/576 |
| 5,766,997 A | 6/1998 | Takeuchi | 438/257 |
| 5,851,891 A | 12/1998 | Dawson et al. | 438/305 |
| 5,874,342 A | 2/1999 | Tsai et al. | 438/301 |
| 5,899,720 A | 5/1999 | Mikagi | 438/303 |
| 5,902,129 A | 5/1999 | Yoshikawa et al. | 438/592 |
| 5,908,309 A | 6/1999 | Andoh | 438/231 |
| 5,937,325 A | 8/1999 | Ishida | 438/655 |
| 5,998,252 A | 12/1999 | Huang | 438/241 |
| 6,020,242 A | 2/2000 | Tsai et al. | 438/279 |
| 6,040,606 A | 3/2000 | Blair | 257/384 |
| 6,063,681 A | 5/2000 | Son | 438/303 |
| 6,072,222 A | 6/2000 | Nistler | 257/383 |
| 6,100,173 A | 8/2000 | Gardner et al. | 438/592 |
| 6,103,610 A | 8/2000 | Blair | 438/592 |
| 6,133,130 A | 10/2000 | Lin et al. | 438/586 |
| 6,136,705 A | 10/2000 | Blair | 438/682 |
| 6,177,319 B1 | 1/2001 | Chen | 438/275 |
| 6,187,617 B1 | 2/2001 | Gauthier, Jr. et al. | 438/197 |
| 6,204,103 B1 | 3/2001 | Bai et al. | 438/224 |
| 6,232,227 B1 | 5/2001 | Mikagi | 438/655 |
| 6,238,984 B1 | 5/2001 | Yang | 438/275 |
| 6,238,986 B1 | 5/2001 | Kepler et al. | 438/586 |
| 6,261,898 B1 | 7/2001 | Wu | 438/241 |
| 6,268,255 B1 | 7/2001 | Besser et al. | 438/303 |
| 6,268,257 B1 | 7/2001 | Wieczorek et al. | 438/305 |
| 6,281,067 B1 | 8/2001 | Chien et al. | 438/241 |
| 6,297,135 B1 | 10/2001 | Talwar et al. | 438/592 |
| 6,306,698 B1 | 10/2001 | Wieczorek et al. | 438/197 |
| 6,383,878 B1 | 5/2002 | Huang | 438/299 |
| 6,383,906 B1 | 5/2002 | Wieczorek et al. | 438/592 |
| 6,391,704 B1 | 5/2002 | Hong et al. | 438/241 |
| 6,403,423 B1 | 6/2002 | Weybright et al. | 438/279 |
| 6,451,679 B1 | 9/2002 | Hu et al. | 438/592 |
| 6,468,904 B1 | 10/2002 | Chen et al. | 438/682 |
| 6,528,401 B2 | 3/2003 | Bae et al. | 438/592 |
| 6,528,422 B1 | 3/2003 | Huang et al. | 438/683 |
| 6,531,724 B1 | 3/2003 | Furukawa et al. | 257/288 |
| 6,534,402 B1 | 3/2003 | Liao | 438/659 |
| 6,534,837 B1 * | 3/2003 | Bai et al. | 257/407 |
| 6,544,876 B1 | 4/2003 | Iyer | 438/592 |
| 6,589,836 B1 * | 7/2003 | Wang et al. | 438/231 |

FOREIGN PATENT DOCUMENTS

| | | |
|---|---|---|
| DE | 19819438 A1 | 3/1999 |
| DE | 19750340 A1 | 6/1999 |
| DE | 19952177 A1 | 5/2000 |
| DE | 19940758 A1 | 3/2001 |
| EP | 0 199 939 A2 | 12/1986 |
| EP | 0 417 522 A2 | 3/1991 |
| EP | 0 727 815 A1 | 9/1996 |
| GB | 09 35 383 A2 | 2/1999 |
| JP | 63157465 A | 8/1988 |
| JP | 05055251 A | 3/1993 |
| JP | 11-40679 | 2/1999 |
| JP | 2002025940 A | 1/2002 |
| WO | WO 95/15005 | 6/1995 |
| WO | WO 96/13061 | 5/1996 |
| WO | WO02/065523 A1 | 8/2002 |

OTHER PUBLICATIONS

U.S. Appl. No. 10/260,926, entitled "Semiconductor Device Having Different Metal Silicide Portions and Method for Fabricating the Semiconductor Device," filed Sep. 30, 2002.

* cited by examiner

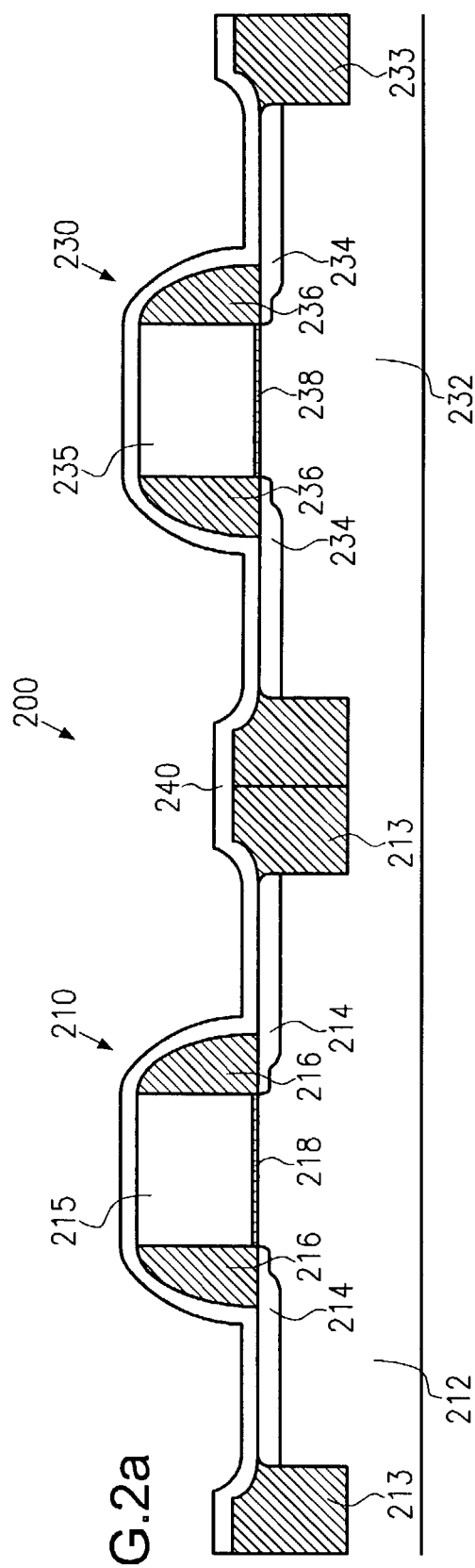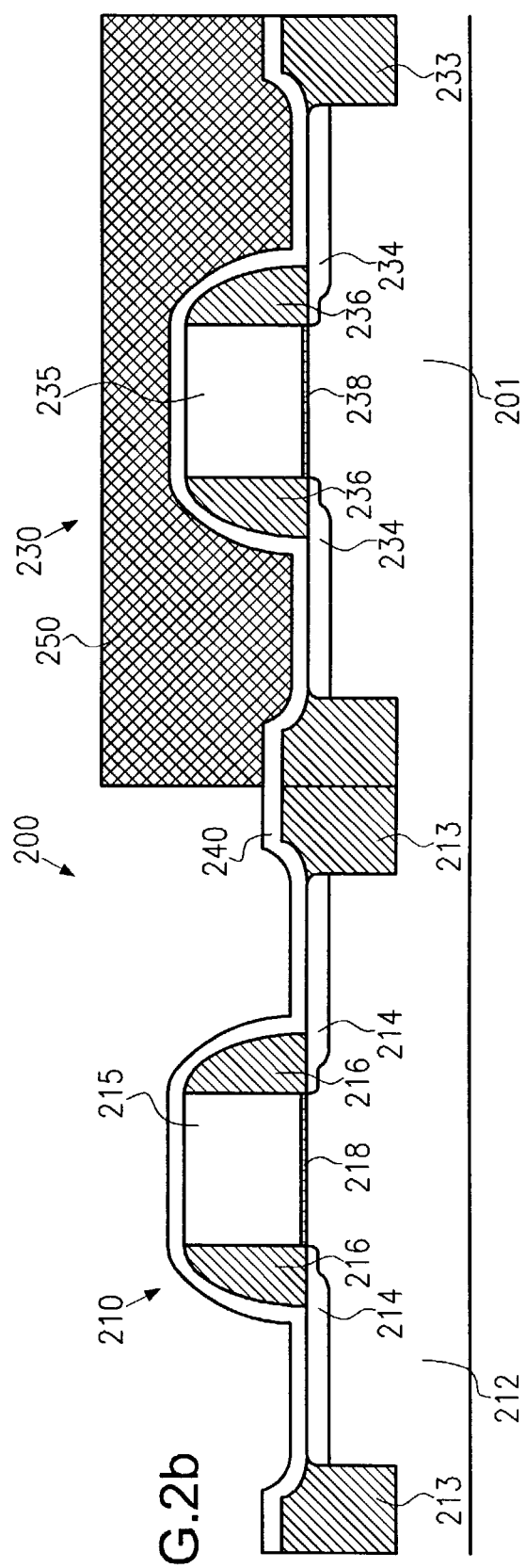

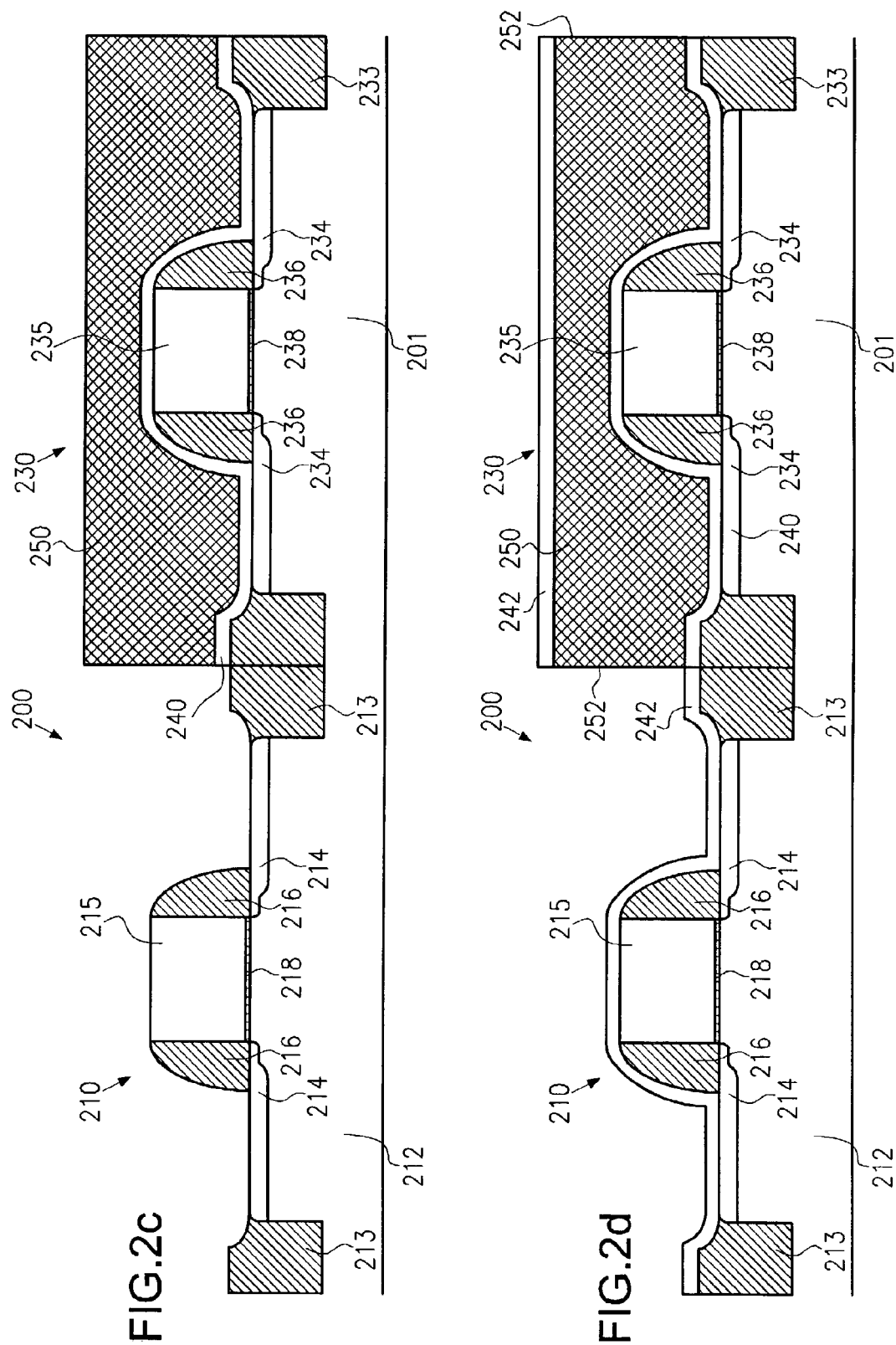

METHOD OF FORMING DIFFERENT SILICIDE PORTIONS ON DIFFERENT SILICON-CONTAINING REGIONS IN A SEMICONDUCTOR DEVICE

BACKGROUND OF THE INVENTION

1. Field of the Invention

Generally, the present invention relates to the field of fabrication of integrated circuits, and more, particularly, to semiconductor devices having metal-silicide portions on semiconductor regions to reduce the sheet resistance of the semiconductor regions, and a method of manufacturing these semiconductor devices.

2. Description of the Related Art

In modem ultra-high density integrated circuits, device features are steadily decreasing to enhance device performance and functionality. Shrinking the feature sizes, however, entails certain problems that may partially offset the advantages obtained by the reduced feature sizes. Generally, reducing the feature sizes of, for example, a transistor element, leads to a decreased channel resistance in the transistor element and thus results in a higher drive current capability and enhanced switching speed of the transistor. In decreasing the feature sizes of these transistor elements, however, the increasing electrical resistance of conductive lines and contact regions, i.e., of regions that provide electrical contact to the periphery of the transistor element, becomes a dominant issue since the cross-sectional area of these lines and regions decreases with decreasing feature sizes. The cross-sectional area, however, determines, in combination with the characteristics of the material comprising the conductive lines and contact regions, the resistance of the respective line or contact region.

The above problems may be exemplified for a typical critical feature size in this respect, also referred to as a critical dimension (CD), such as the extension of the channel of a field effect transistor that forms below a gate electrode between a source region and a drain region of the transistor. Reducing this extension of the channel, commonly referred to as channel length, may significantly improve device performance with respect to fall and rise times of the transistor element due to the smaller capacitance between the gate electrode and the channel and due to the decreased resistance of the shorter channel. Shrinking of the channel length, however, also entails the reduction in size of any conductive lines, such as the gate electrode of the field effect transistor, which is commonly formed of polysilicon, and the contact regions that allow electrical contact to the drain and source regions of the transistor, so that, consequently, the available cross-section for charge carrier transportation is reduced. As a result, the conductive lines and contact regions exhibit a higher resistance unless the reduced cross-section is compensated for by improving the electrical characteristics of the material forming the lines and contact regions, such as the gate electrode, and the drain and source contact regions.

It is thus of particular importance to improve the characteristics of conductive regions that are substantially comprised of semiconductor material such as silicon. For instance, in modem integrated circuits, the individual semiconductor devices, such as field effect transistors, capacitors, and the like, are primarily based on silicon, wherein the individual devices are connected by silicon lines and metal lines. While the resistivity of the metal lines may be improved by replacing the commonly used aluminum by, for example, copper, process engineers are confronted with a challenging task when an improvement in the electrical characteristics of silicon-containing semiconductor lines and semiconductor contact regions is required.

With reference to FIGS. 1a and 1b, an exemplary process for manufacturing an integrated circuit containing, for example, a plurality of MOS transistors, will now be described in order to illustrate the problems involved in improving the electrical characteristics of silicon-containing semiconductor regions in more detail.

In FIG. 1a, a semiconductor structure 100 includes a substrate 101, for example, a silicon substrate, in which a first semiconductor element 110 and a second semiconductor element 130 are formed. The first semiconductor element 110 may, as depicted in FIG. 1a, represent a field effect transistor of a first conductivity type, such as an n-channel transistor, and the second semiconductor element 130 may represent a field effect transistor of a second conductivity type, such as a p-channel transistor. The first semiconductor element 110 comprises shallow trench isolations (STI) 113 that are formed of an insulated material, such as silicon dioxide, and that define an active region 112 in the substrate 101. A gate electrode 115 is formed over a gate insulation layer 118 that separates the gate electrode 115 from the active region 112. Spacer elements 116 made of, for example, silicon dioxide or silicon nitride, are located at the sidewalls of the gate electrode 115. In the active region 112, source and drain regions 114 are formed and exhibit an appropriate dopant profile required to connect to a conductive channel that builds up between the drain and the source region during operation of the first semiconductor element 110.

The second semiconductor element 130 comprises substantially the same parts as the first semiconductor element 110 and corresponding parts are denoted by the same reference numerals except for a "leading 13" instead of a "leading 11." As previously noted, the second semiconductor element 130 may differ from the first semiconductor element 110 in, for example, type of conductivity, that is, type and concentration of dopants provided in the active regions 112 and 132, lateral extension of the gate electrode, also referred to as gate length, cross-sectional area, and the like. Moreover, it should be noted that although the first and second semiconductor elements 110 and 130 in FIGS. 1a and 1b are depicted as transistor elements, the first and second semiconductor elements 110 and 130 may represent any silicon-containing region that is used for charge carrier transportation. For example, relatively long polysilicon lines may connect semiconductor elements on different locations of a single chip area and these polysilicon lines may be regarded as first and second semiconductor elements 110, 130, the electrical characteristics of which are to be improved so as to obtain an enhanced device performance with respect to signal propagation delay.

Again referring to FIG. 1a, in particular the gate length of the first and second semiconductor elements 110 and 130 determines the channel length of these devices and, therefore, as previously pointed out, significantly affects the electrical characteristics of the first and second semiconductor elements 110 and 130, whereby a reduced gate length will result in an increased resistance of the gate electrodes 115, 135 owing to the reduction of the cross-sectional area of the gate electrodes 115, 135.

A typical process flow for forming the semiconductor structure 100 may comprise the following steps. After the formation of the shallow trench isolations 113 and 133 by well-known photolithography techniques, implantation steps are performed to create a required dopant concentration in the active regions 112 and 132. Subsequently, the gate insulation layers 118 and 138 are formed according to design requirements. Thereafter, the gate electrodes 115 and 135 are formed by patterning, for instance a polysilicon layer, by means of sophisticated photolithography and trim etch methods. Then, a further implantation step for forming so-called source and drain extensions within the source and drain regions 114 and 134 is performed and the spacer elements 116 and 126 are formed by deposition and anisotropic etching techniques. The spacer elements 116 and 126 are used as an implantation mask for a subsequent implantation step in which dopant particles are implanted into the source and drain regions 114 and 134 to create the required high dopant concentrations in these regions. It is to be noted that the dopant concentration varies in FIG. 1a in the horizontal direction, i.e., in the length direction of the gate electrodes 115, 135, as well as in the vertical direction, which will hereinafter be referred to as depth direction. Although the dopant profile of the source and drain regions 114 and 134 is depicted as a region having a sharp boundary, in reality the dopant profile varies continuously due to the nature of the implantation process and the subsequent annealing steps that are performed for activating the implanted atoms and for curing the crystalline damage caused by the implantation step. Usually, the dopant profile has to be selected in conformity with other parameters of the first and second semiconductor elements 110 and 130. For example, a short gate length, and thus a short channel length, requires a "shallow" dopant profile in order to avoid the so-called "short channel effect." Accordingly, the peak concentration in the depth direction may be located a few hundred nanometers below the surface of the drain and source regions 114 and 134. Moreover, p-channel transistors may require a different dopant profile than an n-channel transistor element.

As previously noted, the cross-section of the gate electrodes 115 and 135, which may be considered as polysilicon lines, as well as the contact area on top of the source and drain regions 114 and 134, significantly influence the electrical characteristics of the first and second semiconductor elements 110 and 130. Since, generally, these device areas primarily contain a semiconductor material such as silicon in crystalline, polycrystalline and amorphous form, these areas, although they usually include dopants, exhibit a relatively high resistance compared to, for example, a metal line. Consequently, these areas are treated to enhance the conductivity of these regions, thereby improving the overall performance of the devices.

To this end, according to FIG. 1a, a metal layer 140 is deposited over the first and second semiconductor elements 110 and 130. Typically, the metal layer 140 comprises titanium, cobalt or other refractory metals. Subsequently, a first heat treatment, for example, a rapid thermal annealing, is carried out to initiate a chemical reaction between the silicon in the source and drain regions 114, 134, the gate electrodes 115, 135 and the metal contained in the metal layer 140. If, for example, the metal layer 140 substantially comprises cobalt, an average temperature of the first heat treatment may be set to about 400° C. to create a meta-stable cobalt silicon compound exhibiting a relatively high resistivity. Since the silicon contained in the spacer elements 116, 136 and the shallow trench isolations 113, 133 is chemically bound in the form of dioxide or nitride, the metal of the metal layer 140 does not substantially react with the material of the spacer element 115, 136 and the shallow trench isolations 113, 133. After the first heat treatment, the material of the metal layer 140 that has not reacted with the underlying material is removed by, for example, a selective wet etching process. Thereafter, a second heat treatment is performed, for example, a second rapid annealing step with a temperature higher than in the first annealing step, to convert the meta-stable metal-silicon compound into a metal silicide. In the above example, when cobalt is used, a cobalt disilicide is formed in the second annealing step. The metal silicide shows a significantly lower resistance than the meta-stable metal-silicon compound, as well as a significantly lower resistance, by a factor of about 5-10, than the sheet resistance of the doped polysilicon.

FIG. 1b schematically shows the finally obtained first and second semiconductor elements 110 and 130 having formed on the respective source and drain regions 114, 134 and the gate electrodes 115, 135 a metal silicide region 141. Although the metal silicide regions 141 significantly improve the electrical characteristics of the first and second semiconductor elements 110 and 130, there is still room for improvement since, in the conventional process flow, the metal silicide regions 141 have to be formed so as to meet the requirements of the first semiconductor element 110 and the second semiconductor element 130, so that optimizing the characteristics of the silicide regions 141 of the first semiconductor element 110 compromises the effect of the suicide regions 141 of the second semiconductor element 130, and vice versa.

It is thus desirable to have a semiconductor and a method of forming the same in which the characteristics of the conductive semiconductor regions may be individually optimized for different semiconductor elements.

SUMMARY OF THE INVENTION

The present invention is generally directed to a semiconductor device and a method for manufacturing the semiconductor device in which silicon-containing regions receive a metal silicide portion to enhance the electric properties of these regions, wherein the type of material and/or a thickness of the metal silicide portions are individually adjusted in different regions to obtain the electrical conductivity that is required at these different semiconductor regions to further optimize the performance of the semiconductor device.

According to one illustrative embodiment, a method of fabricating a semiconductor device comprises providing a substrate having formed thereon a first silicon-containing region and a second silicon-containing region. The method further comprises selectively forming a first metal layer on the first silicon-containing region and selectively forming a second metal layer on the second silicon-containing region. Moreover, a heat treatment is performed on the substrate to transform, at least partially, the first metal layer in a first metal silicide and the second metal layer in a second metal silicide, wherein the first and the second metal silicide differ from each other in their composition and/or their layer thickness.

According to a further illustrative embodiment, a method of fabricating a semiconductor device comprises forming a first metal layer on a first silicon-containing region and a second silicon-containing region provided on a substrate. Moreover, the first metal layer is selectively removed from the second silicon-containing region and a resist mask is formed to cover the first silicon-containing region and to expose the second silicon-containing region. Additionally, the method includes depositing a second metal layer and removing the resist mask. Moreover, a chemical reaction is initiated between the first and second metal layers and the silicon contained in the first and second region.

According to yet a further embodiment of the present invention, a method for forming a semiconductor device comprises providing a substrate having formed therein a first and a second silicon-containing region, the first and second silicon-containing regions differing from each other in at least one of crystalline structure, dimension, dopant concentration and dopant profile. Moreover, the method includes depositing a first metal layer on the first and second silicon-containing regions and forming a resist mask to expose the first silicon-containing region and to cover the second silicon-containing region. Moreover, the first metal layer is removed from the first silicon-containing region and subsequently a second metal layer is deposited over the substrate. Furthermore, the method includes removing the resist mask and heat treating the substrate to obtain a first silicide portion and a second silicide portion in the first and second silicon-containing regions, respectively, wherein a type of material in the first and the second metal layers and process parameters of the heat treatment are selected to adjust a depth of the first and second silicide portions.

BRIEF DESCRIPTION OF THE DRAWINGS

The invention may be understood by reference to the following description taken in conjunction with the accompanying drawings, in which like reference numerals identify like elements, and in which:

FIGS. 2a to 2f schematically show cross-sectional views of a semiconductor device during various manufacturing stages in accordance with one embodiment of the present invention.

Figure 1A:
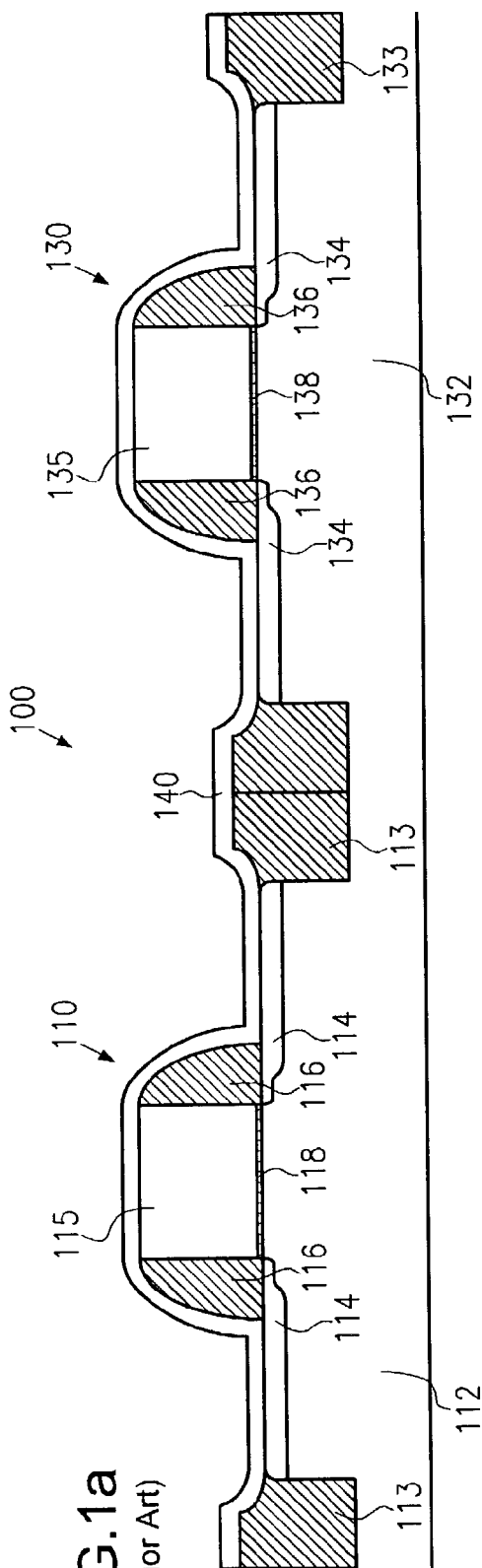
FIGS. 1a and 1b schematically show cross-sectional views of a conventionally manufactured semiconductor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

With reference to FIGS. 2a-2f, illustrative embodiments of the present invention will now be described, wherein, as previously pointed out, two or more different conductive silicon-containing regions receive a silicide portion, the type of material and/or the thickness of which are correspondingly designed to improve the electrical conductivity of these regions. For example, if it is necessary to obtain a similar signal propagation delay for long silicon lines connecting two different die areas, wherein one of the silicon lines exhibits a larger cross-sectional area than the other one, according to the present invention, different silicide portions are formed on these silicon lines to improve the overall characteristics and to substantially compensate for the different cross-sectional areas. The same applies to different types of transistor elements, such as n-channel transistors and p-channel transistors, that, in general, have a different dopant profile and also a different barrier height that experiences a charge carrier at the interface between the silicide portion and the doped silicon-containing region. In this case, the present invention also allows one to appropriately form corresponding silicide portions in the devices to individually optimize the performance of the devices. Similarly, short channel devices generally require a different type of silicide portion than do long channel devices since, for example, in long channel devices, the peak dopant concentration is located more deeply in the drain and source regions than in short channel devices, which require relatively shallow junctions. The present invention allows one to individually adjust the overlap of the silicided portion at a depth at which the peak dopant concentration is located so as to obtain a minimum transition resistance for charge carriers, especially when the barrier height of the metal silicide is selected in conformity with the type of dopants prevailing in the active regions of the transistor devices. Consequently, although in the following detailed description a first and second semiconductor element representing a complementary transistor pair is referred to, the present invention is to cover all aspects in which silicon-containing regions are required to receive individually adapted silicide portions to improve the performance of the individual semiconductor region or to improve the overall performance of the semiconductor device.

In FIG. 2a, a semiconductor structure 200 comprises a substrate 201, for example, a silicon substrate, or any other substrate appropriate for the formation of semiconductor elements. In the substrate 201, a first semiconductor element 210 comprises an active region 212 defined by shallow trench isolations 213. A gate electrode 215 is separated from the active region 212 by a gate insulation layer 218. Spacer elements 216 of an insulating material, such as silicon dioxide or silicon nitride, are formed adjacent to the sidewalls of the gate electrode 215. In the active region 212, source and drain regions 214 are formed.

The semiconductor structure 200 further includes a second semiconductor element 230 comprising substantially the same components as the first semiconductor element 210. Thus, corresponding parts are denoted by the same reference numbers except for a leading "23" instead of a leading "21." It should be borne in mind, however, that although depicted as being quite similar, the first and the second semiconductor elements 210 and 230 differ from each other in the sense as pointed out above. That is, the first and second semiconductor elements 210 and 230 may represent different types of field effect transistors differing, for example, in type of channel conductivity, channel length, position in the substrate 201 and the like. Moreover, the first and second semiconductor elements 210 and 230 may represent a silicon line, such as a polysilicon line connecting different regions in the substrate 201, or may represent a plurality of silicon lines, which differ in type of dopants, dopant concentration, dimensions, i.e., in length or cross-section, crystalline structure, i.e., polycrystalline, crystalline, amorphous and the like.

A first metal layer 240 is deposited on the first and second semiconductor elements 210 and 230. The first metal layer 240 comprises a type of material and is deposited with a thickness such that silicide portions to be formed in the first semiconductor element 210 may substantially exhibit the required electrical characteristics. For example, in one embodiment, the first metal layer may comprise at least one of cobalt, titanium, zirconium, tungsten, nickel, or any other refractory metal that reacts with silicon to form a metal silicide having a relatively low electrical resistance. In another embodiment, the first metal layer may include one or more noble metals such as platinum, palladium or gold and the like. In other embodiments, the first metal layer 240 may be provided as a compound of different metals or may be provided as a bi-layer or as a multi-layer.

Figure 1B:
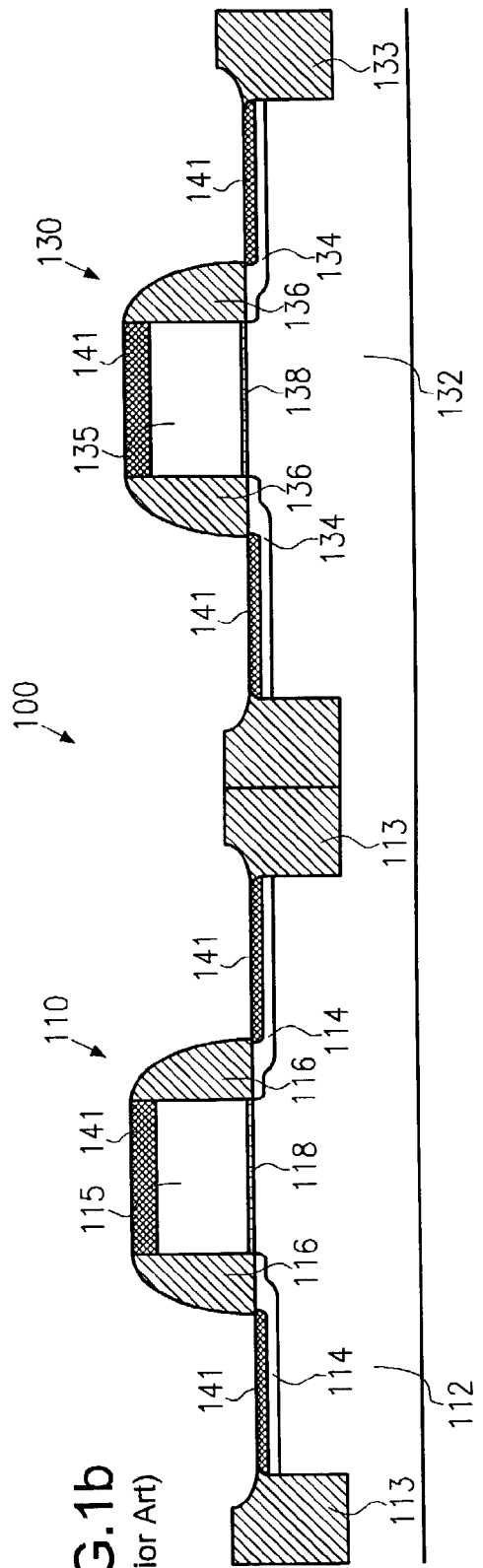

A typical process flow for forming the semiconductor structure 200 may be quite similar to the processes as described with reference to FIGS. 1a and 1b and thus the description of these process steps is omitted.

FIG. 2b schematically shows the semiconductor structure 200 with a resist mask 250 provided on the second semiconductor element 230. The resist mask 250 may be formed by means of standard photolithography techniques, wherein any overlay considerations, i.e., the accuracy of positioning the resist mask 250 on the second semiconductor element 230, are of no great concern since the precise location of the resist mask 250 on the shallow trench isolation 233 is not critical.

FIG. 2c schematically shows the semiconductor structure 200 after the first metal layer 240 is removed from the first semiconductor element 210. The removal of the first metal layer 240 at the first semiconductor element 210 may be accomplished by a selective wet chemical etch process.

FIG. 2d schematically shows the semiconductor structure 200, wherein a second metal layer 242 is deposited over the semiconductor structure 200. The second metal layer 242 may comprise a single metal or, in other embodiments, the second metal layer 242 may comprise two or more metals, such as cobalt, titanium, zirconium, tungsten, nickel, platinum, palladium, gold and any combination thereof, wherein the type of materials contained in the second metal layer 242, the composition of these materials, i.e., whether the materials are provided as a plurality of distinct layers or as compounds, and the thickness may differ from the corresponding characteristics of the first metal layer 240, so that a silicide portion to be formed in the first semiconductor element 210 will substantially exhibit electrical characteristics as required by design rules.

Depositing the second metal layer 242 may be carried out such that sidewall portions 252 of the resist mask 250 remain substantially uncovered by the material of the second metal layer 242. That is, a deposition technique may be employed that allows a minimal step coverage. For instance, a physical vapor deposition (PVD) technique, such as sputter deposition, may be used, wherein process parameters are adjusted in such a manner that metal particles sputtered off of a target hit the semiconductor structure 200 substantially perpendicularly. Consequently, the deposition rate of material of the second metal layer 242 at the sidewall portions 252 is minimal. Adjusting the trajectories of the metal particles directed to the surface of the semiconductor structure 200 such that the metal particles substantially perpendicularly enter the substrate surface may be obtained by using a collimator in the vicinity of the substrate 201. Alternatively, or additionally, the required directionality of the incoming metal particles may also be obtained by adjusting the magnetic and electrical fields during the deposition of the second metal layer 242 such that a minimal step coverage is achieved.

Figure 2E:
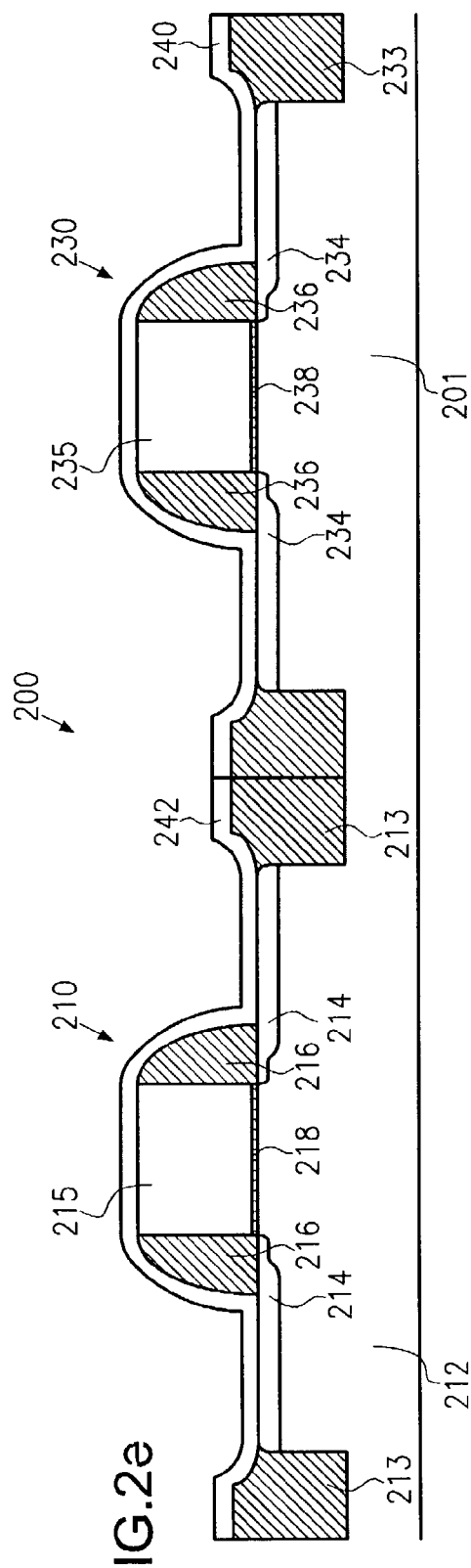

FIG. 2e schematically shows the semiconductor structure 200 with the resist mask 250, and, consequently, the second metal layer 242 formed on top of the resist mask 250, removed from the second semiconductor element 230. Thus, the semiconductor structure 200 comprises the second metal layer 242 on the first semiconductor element 210 and the first metal layer 240 on the second semiconductor element 230, wherein, as previously noted, the first and second metal layers 240 and 242 differ from each other in type of material and/or layer thickness so as to yield the required characteristics for the corresponding silicide portions to be formed in the first and second semiconductor elements 210 and 230.

Removing the resist mask 250 and the second metal layer 242 deposited thereon may be achieved by a selective wet etching process using a chemical agent having a significantly higher etching rate for the resist mask 250 than for the second metal layer 242. Depending on the degree of coverage of the sidewall portions 252 with metal of the second metal layer 242, the predefined thickness of the initially deposited second metal layer 242 may be correspondingly selected so that in the subsequent etching process the thickness of the second metal layer 242 over the first semiconductor element 210 will not decrease below a required minimum thickness. In removing the resist mask 250, the sidewall portions 252 are "underetched" so that, consequently, the mechanical integrity of the second metal layer 242 on top of the resist mask 250 is broken, and the individual parts that split off the second metal layer 242 will be purged away during the etching process. Even if the sidewall portions 252 are covered by the second metal layer 242, the resist mask 250 may nevertheless be reliably removed, although at a prolonged etch time compared to a substantially metal-free sidewall portion 252, since the metal layer thickness at the sidewall portions 252 is considerably smaller than the thickness of the second metal layer 242 at substantially horizontal surface portions of the substrate 201. In one illustrative embodiment, the layer thickness of the second metal layer 242 at the sidewall portions 252 will not exceed about 10% of the layer thickness at horizontal surface portions. In this respect, it is to be noted that a degraded step coverage at other parts of the first semiconductor element 210, for example at the spacer elements 216, is of no concern since in this region no silicide portions will be formed at all.

Figure 2F:
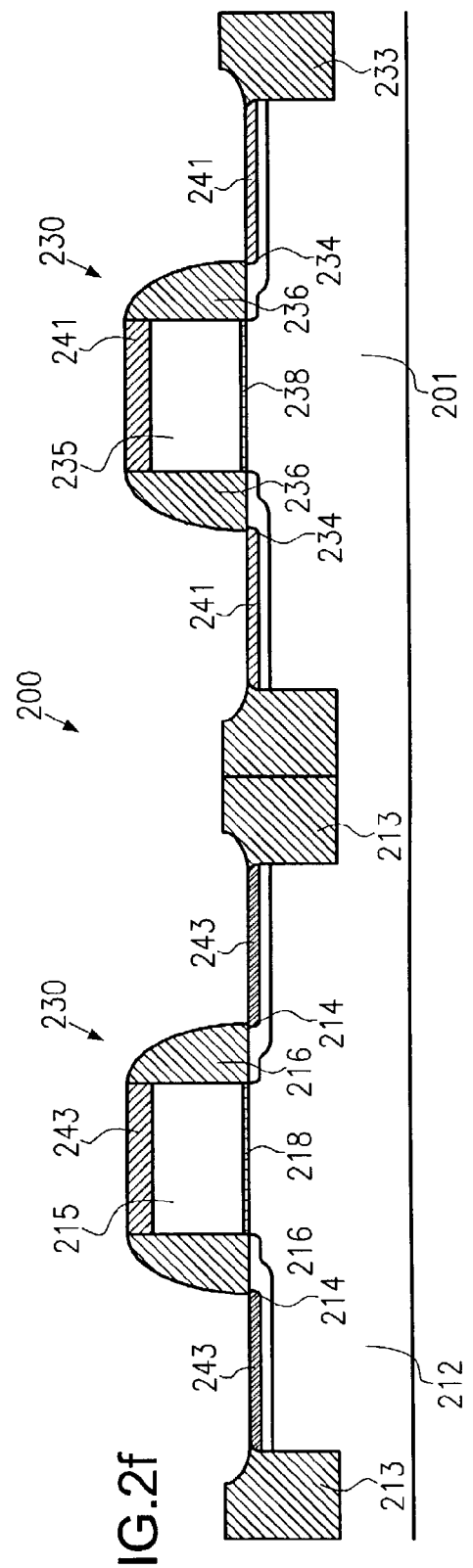

FIG. 2f schematically shows the semiconductor structure 200 with first silicide portions 241 formed in the second semiconductor element 230 and second silicide portions 243 formed in the first semiconductor element 210. Although not depicted in FIG. 2f, the first and second silicide portions 241 and 243 differ from each other in their depth or thickness, i.e., the penetration depth into the regions 214, 215 and 234, 235, respectively and/or in type of material/composition. Thus, the first silicide portions 241 are designed to improve the electrical conductivity within the regions 234 and 235 and are adapted to provide for a substantial overlap with the peak concentration of dopants provided in the regions 234, 235, and/or to yield a minimum barrier height between the silicide portion 241 and the regions 234, 235. The same applies to the second silicide portions 243. That is, the first and second silicide portions 241, 243 are designed to yield a sheet resistance for each of the first and second semiconductor elements 210, 230 that may be within a corresponding predefined range.

The first and second silicide 241, 243 may be obtained by the following process steps. According to one embodiment, a heat treatment is performed, for example a rapid thermal annealing step, to initiate a chemical reaction between the metal in the first and the second metal layers 240, 242 and the silicon contained in the regions 214, 234 and 215, 235. After the first rapid thermal annealing step, with a first temperature for a first time interval, and a subsequent removal of excess metal from the surface of the semiconductor structure 200 by means of a selective etching process, a second rapid thermal annealing step may be performed for a second time interval with a second temperature that is generally higher than the first temperature to obtain a stable metal silicide having a relatively low electrical resistance. In removing the excess metal of the first and second metal layers 240, 242 between the first and second rapid thermal annealing steps, the etch agent does not need to be selective with respect to the first and second metal layers 240, 242 so that the excess metal may be removed in a common etching process.

During the first rapid thermal annealing step, diffusion of the atoms of the regions 214, 234, 215, 235 and of the atoms of the first and second metal layers 240, 242 takes place so that a continuous reaction between the silicon and the metal is maintained. The degree of diffusion, and thus the amount of metal-silicon compound formed during the reaction, depends on the type of material, the temperature and the duration of the annealing process. Generally, metals having a higher melting temperature tend to show a lower diffusion activity. Thus, the thickness of the metal-silicon compound may be partially adjusted by controlling the first average temperature and the first time interval. In the second rapid thermal annealing step, with the second temperature, a reaction takes place in which the metal-silicon compound is converted into a low-ohmic phase. Typically, the second average temperature is higher than the first temperature to obtain the stable metal silicide having a relatively low electrical resistance. The second average temperature and the second time interval may also be controlled to obtain the required sheet resistance in each of the regions 214, 215, 234, 235.

It is to be noted that although the first and second metal layers 240, 242 differ from each other, the sheet resistance in the first and second semiconductor elements 210 and 230 may nevertheless be individually adjusted in a single common heat treatment, for example, the two-step annealing described above, since the reaction characteristics of the materials comprising the first and second metal layers 240, 242 are well known and may be selected to yield the desired sheet resistance.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of fabricating a semiconductor device, comprising:

providing a substrate having formed thereon a first silicon containing region and a second silicon containing region;

selectively forming a first metal layer on the first silicon containing region;

selectively forming a second metal layer on the second silicon containing region; and heat treating the substrate to transform, at least partially, the first metal layer in a first metal silicide and the second metal layer in a second metal silicide, wherein the first and second metal silicide portions differ from each other in at least one of composition and thickness, wherein selectively forming the first metal layer includes:

depositing the first metal layer over the first and second silicon containing regions;

forming a resist mask on the first silicon containing region;

and removing the first metal layer from the second silicon containing region.

2. The method of claim 1, wherein selectively forming the second metal layer on the second silicon containing region includes depositing the second metal layer on the second silicon containing region and the resist mask; and removing the resist mask.

3. The method of claim 2, wherein depositing the second metal layer includes controlling the metal deposition such that a step coverage of the resist mask is minimal.

4. The method of claim 3, wherein the step coverage is reduced by employing a vapour deposition technique in which metal particles hit the substrate substantially perpendicularly.

5. The method of claim 3, wherein a directionality of metal particles hitting the substrate during deposition of the second metal layer is controlled by at least one of using a collimator and controlling the magnetic and electrical fields used during deposition of the second metal layer.

6. A method of fabricating a semiconductor device, comprising:

providing a substrate having formed thereon a first silicon containing region and a second silicon containing region;

selectively forming a first metal layer on the first silicon containing region;

selectively forming a second metal layer on the second silicon containing region; and heat treating the substrate to transform, at least partially, the first metal layer in a first metal silicide and the second metal layer in a second metal silicide, wherein the first and second metal silicide portions differ from each other in at least one of composition and thickness, wherein at least one of type of metal and layer thickness of the first and the second metal layers, temperature and duration of the heat treatment are selected to attain a first and a second sheet resistance in the first and second silicide portions such that the first and second sheet resistances are within corresponding predefined ranges.

7. A method of fabricating a semiconductor device, comprising:

providing a substrate having formed thereon a first silicon containing region and a second silicon containing region;

selectively forming a first metal layer on the first silicon containing region;

selectively forming a second metal layer on the second silicon containing region; and heat treating the substrate to transform, at least partially, the first metal layer in a first metal silicide and the second metal layer in a second metal silicide, wherein the first and second metal silicide portions differ from each other in at least one of composition and thickness, wherein heat treating the substrate includes:

annealing the substrate with a first average temperature and for a first time interval;

removing material of the first and second metal layers that has not reacted with the underlying material; and annealing the substrate with a second average temperature for a second time interval, wherein the first and second average temperatures and the first and second time intervals are selected in accordance with the first and second metal layers to obtain a sheet resistance within a predefined range in the first and the second silicon containing regions.

8. A method of fabricating a semiconductor device, comprising:
   providing a substrate having formed thereon a first silicon containing region and a second silicon containing region;
   selectively forming a first metal layer on the first silicon containing region;
   selectively forming a second metal layer on the second silicon containing region; and
   heat treating the substrate to transform, at least partially, the first metal layer in a first metal silicide and the second metal layer in a second metal silicide, wherein the first and second metal silicide portions differ from each other in at least one of composition and thickness, wherein the first silicon containing region includes at least one n-channel field effect transistor and the second silicon containing region includes at least one p-channel field effect transistor.

9. A method of fabricating a semiconductor device, comprising:
   providing a substrate having formed thereon a first silicon containing region and a second silicon containing region;
   selectively forming a first metal layer on the first silicon containing region;
   selectively forming a second metal layer on the second silicon containing region; and
   heat treating the substrate to transform, at least partially, the first metal layer in a first metal silicide and the second metal layer in a second metal silicide, wherein the first and second metal silicide portions differ from each other in at least one of composition and thickness, wherein the first silicon containing region includes a silicon line having a first length and a first cross section and the second silicon containing region includes a second silicon line having a second length and a second cross section at least one of the first length and the first cross section differing from the corresponding second length and second cross section.

10. A method of fabricating a semiconductor device, comprising:
    providing a substrate having formed thereon a first silicon containing region and a second silicon containing region;
    selectively forming a first metal layer on the first silicon containing region;
    selectively forming a second metal layer on the second silicon containing region; and
    heat treating the substrate to transform, at least partially, the first metal layer in a first metal silicide and the second metal layer in a second metal silicide, wherein the first and second metal silicide portions differ from each other in at least one of composition and thickness, wherein the first silicon containing region differs from the second silicon containing region in at least one of type of dopants, dopant profile, crystalline structure and composition of material in the first and second silicon containing regions.

11. A method of fabricating a semiconductor device comprising:
    forming a first metal layer on a first silicon containing region and a second silicon containing region provided on a substrate;
    forming a resist mask to cover the first silicon containing region and to expose the second silicon containing region;
    removing the first metal layer from the second silicon containing region;
    depositing a second metal layer over the second silicon containing region and the resist mask;
    removing the resist mask; and
    initiating a chemical reaction between the first and second metal layers and the silicon contained in the first and second regions to form a first and second silicide portions in the first and second silicon containing regions, respectively.

12. The method of claim 11, wherein depositing the second metal layer includes controlling the metal deposition such that a step coverage of the resist mask is minimal.

13. The method of claim 12, wherein the step coverage is reduced by employing a vapour deposition technique in which metal particles hit the substrate substantially perpendicularly.

14. The method of claim 12, wherein a directionality of metal particles hitting the substrate during deposition of the second metal layer is controlled by at least one of using a collimator and controlling the magnetic and electrical fields used during deposition of the second metal layer.

15. The method of claim 10, wherein at least one of type of metal and layer thickness of the first and the second metal layers, temperature and duration of initiating the chemical reaction are selected to attain a first and a second sheet resistance in the first and second silicide portions such that the first and second sheet resistances are within corresponding predefined ranges.

16. The method of claim 10, wherein at least one of the first and second metal layers comprises at least one of cobalt, titanium, tantalum, zirconium, nickel, tungsten, a noble metal and any combination thereof.

17. The method of claim 10, wherein initiating a chemical reaction includes:
    annealing the substrate with a first average temperature and for a first time interval;
    removing material of the first and second metal layers that has not reacted with the underlying material; and
    annealing the substrate with a second average temperature for a second time interval, wherein the first and second average temperatures and the first and second time intervals are selected in accordance with the first and second metal layers to obtain a sheet resistance within a predefined range in the first and the second silicon containing regions.

18. The method of claim 10, wherein the first silicon containing region includes at least one n-channel field effect transistor and the second silicon containing region includes at least one p-channel field effect transistor.

19. The method of claim 10, wherein the first silicon containing region includes a silicon line having a first length and a first cross section and the second silicon containing region includes a second silicon line having a second length and a second cross section, at least one of the first length and the first cross section differing from the corresponding second length and second cross section.

20. The method of claim 10, wherein the first silicon containing region differs from the second silicon containing region in at least one of type of dopants, dopant profile, crystalline structure and composition of material in the first and second silicon containing regions.

21. A method of forming a semiconductor device, the method comprising
providing a substrate having formed therein a first and a second silicon containing region, the first and second silicon containing regions differing from each other in at least one of crystalline structure, dimension, dopant concentration and dopant profile;
depositing a first metal layer on the first and second silicon containing regions;
forming a resist mask to expose the first silicon containing region and to cover the second silicon containing region;
removing the first metal layer from the first silicon containing region;
depositing a second metal layer over the first silicon containing region and the resist mask;
removing the resist mask; and
heat treating the substrate to obtain a first silicide portion and a second silicide portion in the first and second silicon containing regions, respectively, wherein a type of material in the first and the second metal layers and process parameters of the heat treatment are selected to adjust a depth of the first and second silicide portions.

22. The method of claim 21, further comprising forming at least one first transistor element in the first silicon containing region and forming at least one second transistor element in the second silicon containing region.

23. The method of claim 22, wherein the at least one first transistor element and the at least one second transistor element differ from each other in at least one of type of channel conductivity, channel length, dopant concentration and dopant profile.

24. The method of claim 21, further comprising forming at least one first conductive line in the first silicon containing region and forming at least one second conductive line in the second silicon containing region.

25. The method of claim 24, wherein the at least one first conductive line and the at least one second conductive line differ from each other in at least one of type of dopants, line length, line cross-section, dopant concentration and dopant profile.

26. The method of claim 21, wherein depositing the second metal layer includes controlling the metal deposition such that a step coverage of the resist mask is minimal.

27. The method of claim 26, wherein the step coverage is reduced by employing a vapour deposition technique in which metal particles hit the substrate substantially perpendicularly.

28. The method of claim 26, wherein a directionality of metal particles hitting the substrate during deposition of the second metal layer is controlled by at least one of using a collimator and controlling the magnetic and electrical fields used during deposition of the second metal layer.

29. The method of claim 21, wherein at least one of type of metal and layer thickness of the first and the second metal layers, temperature and duration of the heat treatment are selected to attain a first and a second sheet resistance in the first and second silicide portions such that the first and second sheet resistances are within corresponding predefined ranges.

30. The method of claim 21, wherein at least one of the first and second metal layers comprises at least one of cobalt, titanium, tantalum, zirconium, nickel, tungsten, a noble metal and any combination thereof.

* * * * *